United States Patent
Oka et al.

(10) Patent No.: US 8,197,915 B2
(45) Date of Patent: Jun. 12, 2012

(54) METHOD OF DEPOSITING SILICON OXIDE FILM BY PLASMA ENHANCED ATOMIC LAYER DEPOSITION AT LOW TEMPERATURE

(75) Inventors: Takahiro Oka, Sagamihara (JP); Akira Shimizu, Sagamihara (JP)

(73) Assignee: ASM Japan K.K., Tokyo (JP)

(*) Notice: Subject to any disclaimer, the term of this patent is extended or adjusted under 35 U.S.C. 154(b) by 420 days.

(21) Appl. No.: 12/416,809

(22) Filed: Apr. 1, 2009

(65) Prior Publication Data
US 2010/0255218 A1 Oct. 7, 2010

(51) Int. Cl.
*H05H 1/24* (2006.01)
*C23C 16/00* (2006.01)
(52) U.S. Cl. .............. 427/579; 427/569; 427/248.1
(58) Field of Classification Search .......... 427/579, 427/569, 248.1
See application file for complete search history.

(56) References Cited

U.S. PATENT DOCUMENTS

| | | | | |
|---|---|---|---|---|
| 6,391,803 B1* | 5/2002 | Kim et al. | ............... | 438/787 |
| 7,399,388 B2* | 7/2008 | Moghadam et al. | ..... | 204/192.37 |
| 2007/0190744 A1* | 8/2007 | Hiraiwa et al. | ............... | 438/424 |
| 2007/0277735 A1* | 12/2007 | Mokhlesi et al. | ......... | 118/723 R |
| 2008/0113097 A1 | 5/2008 | Mahajani et al. | | |
| 2009/0041952 A1* | 2/2009 | Yoon et al. | ............... | 427/579 |
| 2009/0275205 A1* | 11/2009 | Kiehlbauch et al. | ......... | 438/712 |

FOREIGN PATENT DOCUMENTS

WO    WO 2004010467 A2 *  1/2004

OTHER PUBLICATIONS

Lim et al. Low-Temperature Growth of SiO2 Films by Plasma-Enhanced Atomic Layer Deposition, ETRI Journal, 27 (1), Feb. 2005, pp. 118-121.*

* cited by examiner

*Primary Examiner* — Kelly M Gambetta
(74) *Attorney, Agent, or Firm* — Snell & Wilmer L.L.P.

(57) ABSTRACT

A method of depositing a silicon oxide film on a resist pattern or etched lines formed on a substrate by plasma enhanced atomic layer deposition (PEALD) includes: providing a substrate on which a resist pattern or etched lines are formed in a PEALD reactor; controlling a temperature of a susceptor on which the substrate is placed at less than 50° C. as a deposition temperature; introducing a silicon-containing precursor and an oxygen-supplying reactant to the PEALD reactor and applying RF power therein in a cycle, while the deposition temperature is controlled substantially or nearly at a constant temperature of less than 50° C., thereby depositing a silicon oxide atomic layer on the resist pattern or etched lines; and repeating the cycle multiple times substantially or nearly at the constant temperature to deposit a silicon oxide atomic film on the resist pattern or etched lines.

19 Claims, 5 Drawing Sheets

METHOD OF DEPOSITING SILICON OXIDE FILM BY PLASMA ENHANCED ATOMIC LAYER DEPOSITION AT LOW TEMPERATURE

BACKGROUND

1. Field of the Invention

The present invention relates generally to a method of depositing a silicon oxide film by plasma enhanced atomic layer deposition (PEALD), and particularly, to a method of inhibiting deformation of an organic film such as a resist due to damage caused during film formation by PEALD.

2. Description of the Related Art

Traditionally atomic layer deposition (ALD) of $SiO_2$ film involves deposition of film at approx. 300° C. In recent years, however, the demand for depositing a conformal $SiO_2$ film on resist is increasing in order to support patterns finer than the lithography resolution required by increasingly integrated devices. Various types of resist are available, but all these resist materials are organic substances and therefore disappear at high temperature, which poses a problem.

SUMMARY

In an embodiment of the present invention, damage and deformation of the organic film on the substrate can be inhibited in the process of building a laminated structure on the substrate via PEALD, thereby enabling advanced, fine patterns to be created by means of lithography. In an embodiment of the present invention, a conformal silicon oxide film can be formed at high film deposition speed. In an embodiment that achieves at least one of the above, a silicon oxide film is deposited on a patterned organic film formed by PEALD, wherein the embodiment is characterized in that the film deposition speed is controlled as a linear function of the film deposition temperature in a region where the film deposition temperature is low. In an embodiment, damage and deformation of the organic film can be effectively inhibited in the $SiO_2$ PEALD film deposition process by controlling the film deposition temperature at a constant level below 50° C. or so, or preferably at approx. 40° C. or below, or more preferably at approx. 30° C. or below. According to an experiment carried out by the inventor, in some cases the resist shape deformed due to damage, even at 50° C., and therefore it is desirable to lower the film deposition temperature further. At a constant temperature of approx. 30° C. or below, damage can be virtually prevented regardless of the type of resist. In this temperature region, it is possible to virtually control the film deposition speed as a complete linear function or roughly linear function of the film deposition temperature, in which case controlling the film thickness and film deposition time becomes markedly simple and the throughput can be improved. Surprisingly, the film deposition speed is a negative linear function of the film deposition temperature.

In an embodiment of $SiO_2$ film deposition by PEALD, introduction of precursor gas that supplies silicon and application of RF power are pulsed, while introduction of gas that supplies oxygen, introduction of purge gas and evacuation are performed under constant conditions, within one ALD cycle. In other words, $SiO_2$ film deposition by PEALD is controlled by means of controlling the lengths of and intervals between the pulse used for introduction of precursor gas that supplies silicon and the pulse used for application of RF power (or only by controlling these two pulses in an embodiment) within one cycle.

In the above, temperature control is difficult using conventional susceptor heaters if the PEALD method is used to deposit a $SiO_2$ film at low temperatures of below 50° C. With any conventional susceptor heater, approx. 50° C. is the limit of temperature control and therefore the heater must be turned off and the process implemented at room temperature if a film must be deposited at lower temperatures. Since no heater or other similar mechanism is used, however, temperature stability and repeatability cannot be achieved in the process implemented in a normal temperature range of approx. 20 to 30° C. In an embodiment of the present invention, a structure with a chiller unit is used to circulate coolant inside the susceptor and thereby enable heating and cooling. This way, temperature control over a range of, say, −10 to 50° C. (or temperature control range of −10 to 80° C.) becomes possible and a film can be deposited at low temperature with good repeatability.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

DETAILED DESCRIPTION

Figure 1:
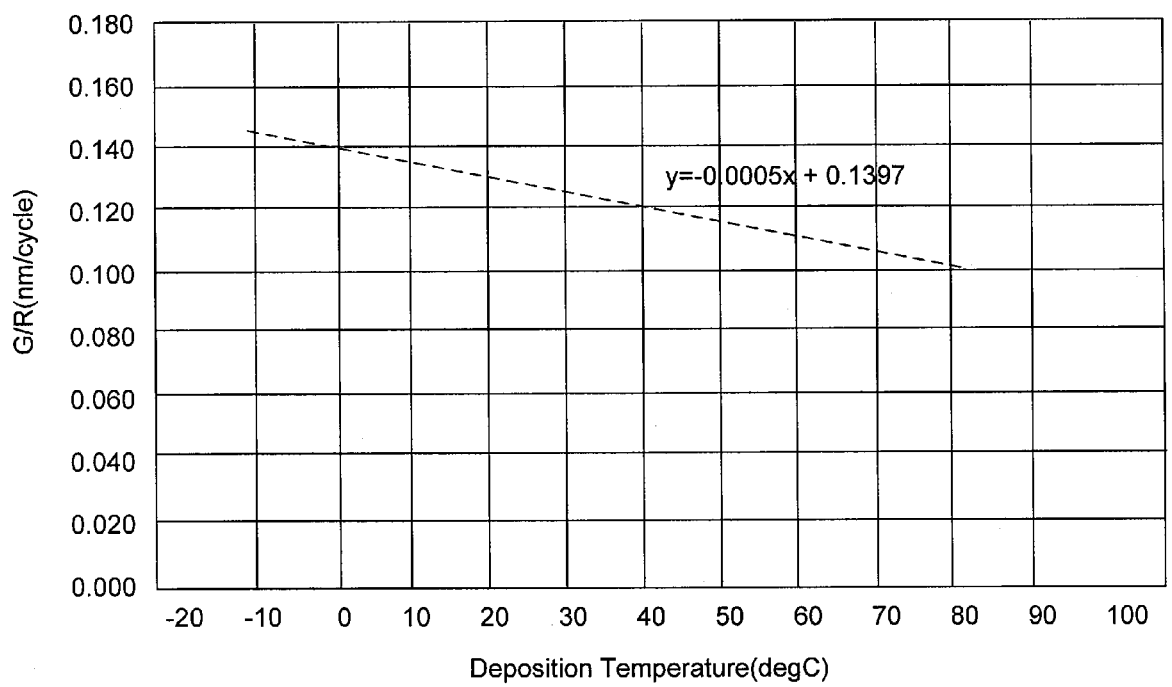
FIG. 1 is a graph showing the relationship between the growth rate (nm/cycle) and deposition temperature (° C.) of a $SiO_2$ ALD film according to an embodiment of the present invention.

The present invention includes, but is not limited to, the following embodiments:

In an embodiment, a method of depositing a silicon oxide film on a resist pattern or etched lines formed on a substrate by plasma enhanced atomic layer deposition (PEALD), comprises: (i) providing a substrate on which a resist pattern or etched lines are formed in a PEALD reactor; (ii) controlling a temperature of a susceptor on which the substrate is placed at less than 50° C. as a deposition temperature; (iii) introducing a silicon-containing precursor and an oxygen-supplying reactant to the PEALD reactor and applying RF power therein in a cycle, while the deposition temperature is controlled substantially or nearly at a constant temperature of less than 50° C., thereby depositing a silicon oxide atomic layer on the resist pattern or etched lines; and (iv) repeating the cycle multiple times substantially or nearly at the constant temperature to deposit a silicon oxide atomic film on the resist pattern or etched lines.

In an embodiment, the deposition temperature may be controlled substantially or nearly at a constant temperature of 40° C. or lower or a constant temperature of 30° C. or lower.

In any of the foregoing embodiments, in the cycle, a purge gas may be introduced to the PEALD reactor to remove excess of the silicon-containing precursor.

In any of the foregoing embodiments, in the cycle, the silicon-containing precursor may be introduced in a first pulse, and the RF power may be applied in a second pulse, wherein the first and second pulses do not overlap.

In any of the foregoing embodiments, the oxygen-supplying reactant may be introduced constantly.

In any of the foregoing embodiments, in the cycle, a purge gas may be constantly introduced to the PEALD reactor.

In any of the foregoing embodiments, the silicon-containing precursor may be an amino silane gas. In an embodiment, the amino silane gas may be selected from the group consisting of BDEAS (bisdiethylaminosilane), BEMAS (bisethylmethylaminosilane), 3DMAS (trisdimethylaminosilane), and HEAD (hexakisethylaminosilane).

In any of the foregoing embodiments, the oxygen-supplying gas may be $O_2$ gas.

In any of the foregoing embodiments, the purge gas may be a rare gas. In an embodiment, Ar or He may be used as the purge gas.

In any of the foregoing embodiments, the cycle may have a duration of about 1.5 to about 3.0 seconds. In another embodiment, the cycle may have a duration of about 1 to about 5 seconds.

In any of the foregoing embodiments, a growth rate of the silicon oxide layer may be about 0.120 nm/cycle or higher. In an embodiment, the growth rate of the silicon oxide layer may be about 0.125 nm/cycle to about 0.145 nm/cycle.

In any of the foregoing embodiments, the temperature of the susceptor may be set according to the following equation: $y=-0.0005x+0.1397$ wherein y is the growth rate (nm), and x is the deposition temperature (° C.). In another embodiment, a growth rate (nm) y' may be y±10%.

In any of the foregoing embodiments, deposition temperature may be adjusted by passing a coolant through a conduit formed in the susceptor.

In any of the foregoing embodiments, the RF power may be applied using a capacitively coupled parallel electrodes, and the susceptor functions as a lower electrode and holds a single substrate.

Any of the foregoing methods may further comprise, before the substrate is provided in the PEALD reactor: (I) obtaining a standard curve defining a relationship between the growth rate of the silicon oxide layer and the deposition temperature; (II) setting a growth rate of the silicon oxide layer in a cycle; and (III) obtaining a deposition temperature based on the set growth rate using the standard curve. In an embodiment, the standard curve may be $y=-0.0005x+0.1397$ wherein y is the growth rate (nm), and x is the deposition temperature (° C.).

The present invention will be explained below with reference to typical embodiments which are not intended to limit the present invention.

One characteristic of an embodiment of the present invention relates to the system configuration designed to adjust the film deposition temperature. With any conventional susceptor heater, approx. 50° C. is the limit of temperature control and thus the heater must be turned off and the process implemented at room temperature if a film must be deposited at lower temperatures. Since no heater or other similar mechanism is used, however, temperature stability and repeatability cannot be achieved in the process implemented in a normal temperature range of approx. 20 to 30° C. Therefore, a susceptor capable of heating and cooling by means of coolant circulated by a chiller unit is introduced, which then makes it possible to control temperatures over a range of −10 to 80° C. and deposit a film at low temperature with good repeatability.

Other characteristic of an embodiment of the present invention is that resist damage is inhibited when a film is deposited on an organic film or other type of resist. By lowering the film deposition temperature, it is possible to prevent resist damage and loss caused by depositing a film on resist, which is the case in conventional high-temperature $SiO_2$-ALD processes.

Other characteristic of an embodiment of the present invention is that the film growth speed is improved. The film deposition speed can be improved as the film deposition temperature is lowered. As a result, the throughput can be improved.

Figure 5A:
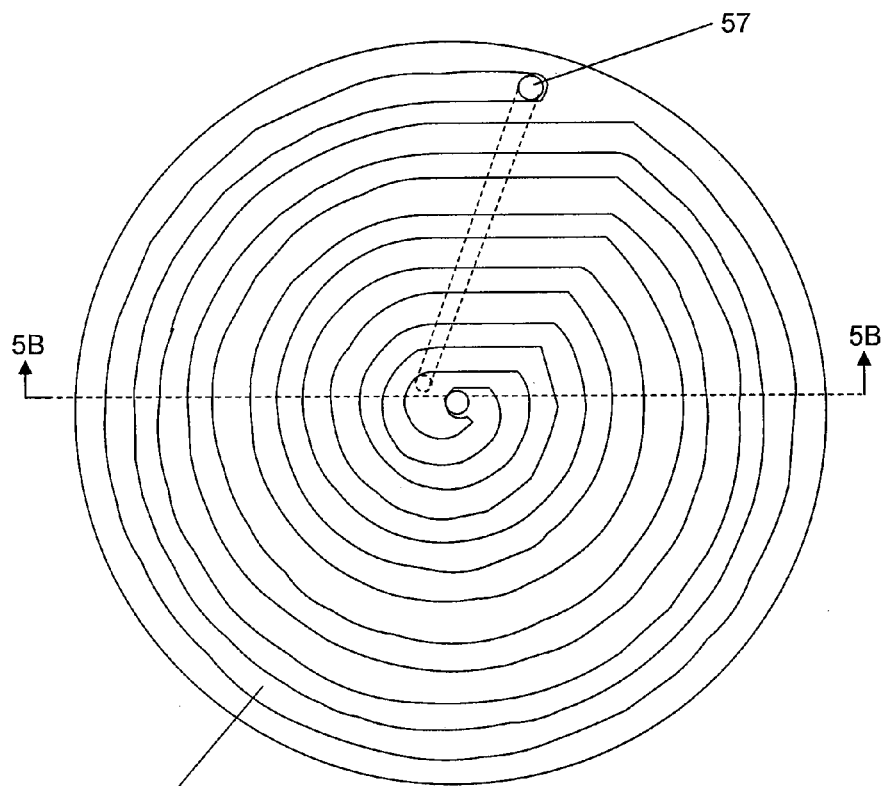
FIGS. 5A and 5B are a schematic plane view and a schematic cross sectional view, respectively, of a susceptor equipped with a chiller unit according to an embodiment of the present invention.
Figure 5B:
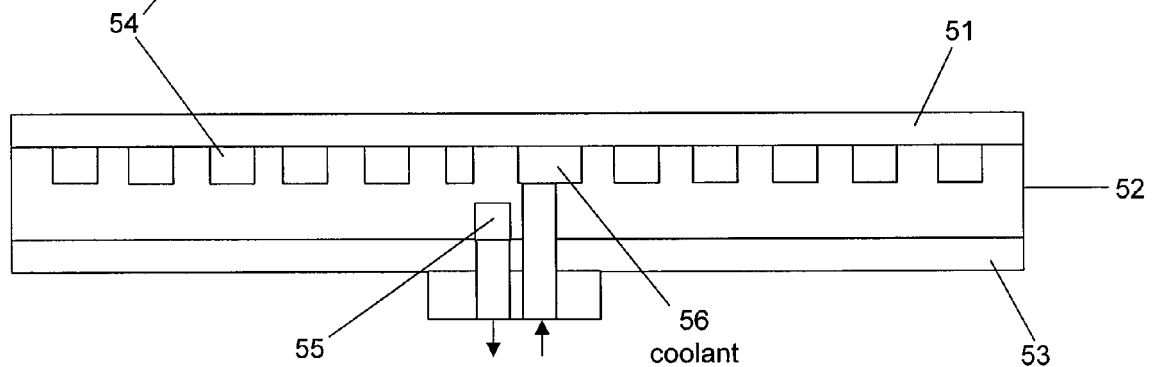

The system configuration in an embodiment of the present invention is explained below. It should be noted, however, that the present invention is not at all limited to the following. FIG. 5A is a plan view showing an example of a susceptor equipped with a chiller unit, while FIG. 5B is a longitudinal cross-section view when FIG. 5A is cut along line 5B. A plate 52 is provided on which a groove 54 is formed in a spiral pattern, as shown in FIG. 5A, to let the coolant (such as ethylene glycol) flow between a top plate 51 and a susceptor 53, and the coolant is caused to flow into this groove and circulate. The coolant flows into the spiral groove from an inlet 56 provided near the center of the plate, travels in a spiral pattern toward the outer side, and is discharged, upon reaching an end 57 of the groove provided near the outer periphery, from an outlet 55 provided near the center of the plate. The temperature can be adjusted over a range of −10 to 80° C. using the chiller. By expanding the film deposition temperature range to cover −10° C. up to 80° C., it becomes possible to prevent various types of damage otherwise sustained by organic films. In an embodiment, the temperature should be adjusted to below 50° C., or preferably to 40° C. or below, or more preferably to 30° C. or below (or even to 20° C. or below, 10° C. or below, or 0° C. or below, in an embodiment), from the viewpoint of inhibiting damage to organic films. The speed and rate of coolant flow can be adjusted as deemed appropriate so that the top plate temperature can be controlled constant at a desired level.

The flow channel need not have a spiral form extending from the center toward the outer side, but it can have a spiral form extending from the outer side toward the center, or a zigzag form extending from one end of the outer periphery to the other end. Or, multiple flow channels extending from the center toward the outer periphery may be formed in a radial pattern. In the above embodiment, the total length of the flow channel should be at least twice, or preferably three times, the circumference.

Since lowering the temperature has the effect of reducing change in resist shape, the temperature may be lower than −10° C. If the temperature is lowered below −10° C., however, a large-scale cooling mechanism becomes necessary instead of the chiller unit.

As for the coolant, in an embodiment it may be selected and used as deemed appropriate from ethylene glycol, glycerin and other anti-freezing fluids, air (room temperature or above), water (0° C. or above), nitrogen gas, liquid nitrogen, carbon dioxide, ammonia, liquid helium, hydrogen, propane, butane, isobutane and other hydrocarbon gases, CFCs, halogenated hydrocarbons, etc.

As for the cooling method, cooling by coolant circulated by a chiller, electronic cooling using Peltier elements, force-feed cooling using $N_2$ gas or any other method can be selected and used as deemed appropriate.

In an embodiment, the $SiO_2$ film deposition conditions other than temperature may be set as follows, for example:
RF power (13.56 MHz): 20 to 100 W
Film deposition pressure: Approx. 400 Pa
Flow rate of silicon-containing precursor: 300 to 500 sccm
Flow rate of oxygen: 100 to 1000 sccm
Flow rate of purge gas (such as Ar): Approx. 1500 sccm In an embodiment, a desired pressure can be selected within a range of approx. 100 to 1000 Pa, and a desired flow rate of purge gas can also be selected within a range of 1000 to 2500 sccm.

Figure 3:
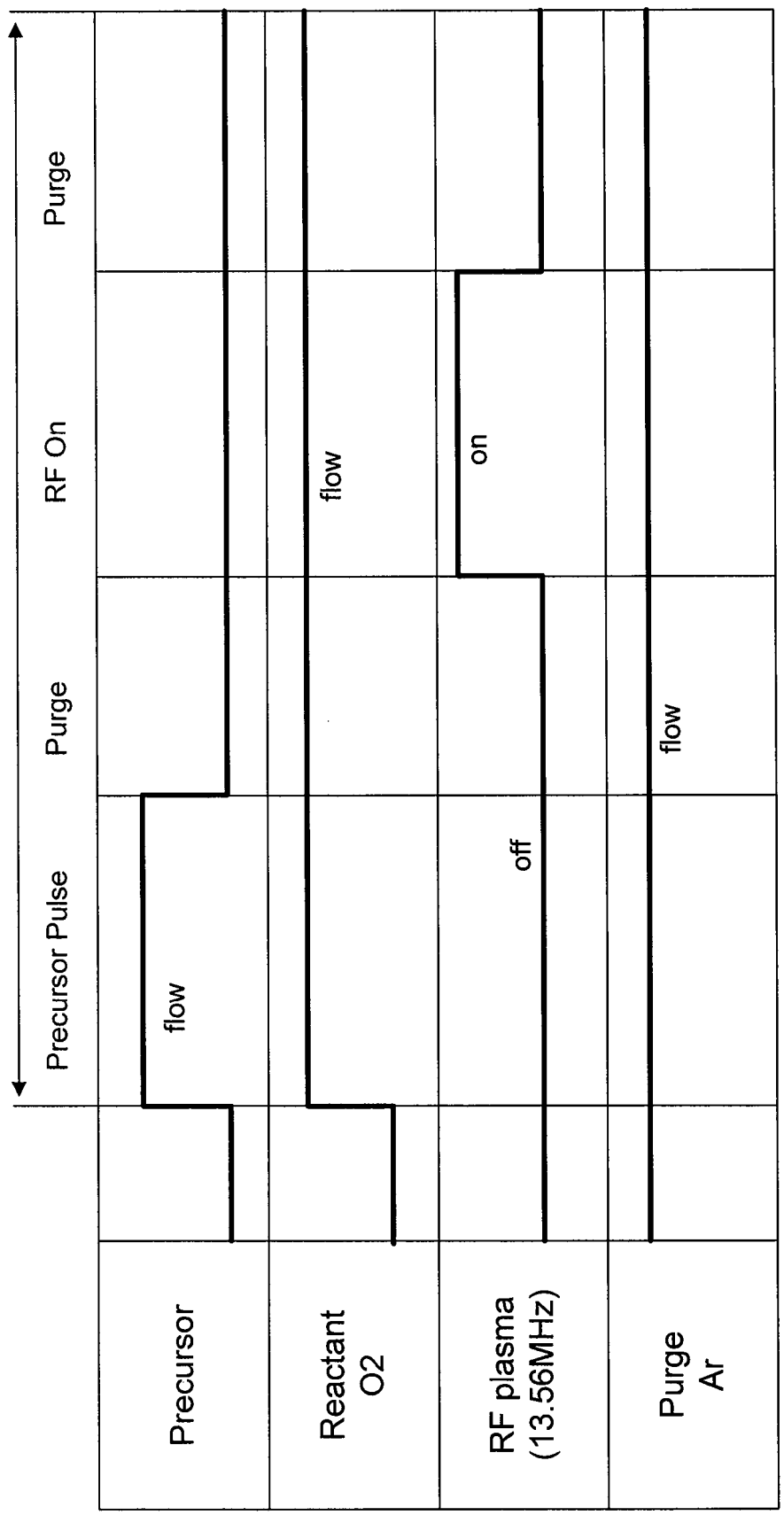
FIG. 3 is a timing chart for one cycle for depositing a $SiO_2$ ALD film by PEALD according to an embodiment of the present invention.

An example of a timing chart of one PEALD cycle is shown in FIG. 3. First, purge gas is caused to flow into the reactor and the flow is stabilized, after which purge gas will always flow within the reactor at a constant rate. Next, silicon precursor is supplied with a single pulse, while oxygen reactant gas is introduced to the reactor continuously at a constant rate. When the silicon precursor pulse stops, RF power is applied with a single pulse. The silicon precursor pulse and RF power pulse do not overlap with each other. Similar to continuous flow of purge gas, the reactor is always evacuated and a constant pressure is maintained. Purge gas continues to flow in even while silicon precursor is being introduced via pulsing. Once the silicon precursor pulse stops, however, only purge gas and oxygen reactant gas will flow in and therefore virtually all silicon precursor can be purged from the substrate surface. FIG. 3 shows one cycle where, in an embodiment, one cycle takes approx. 1.5 to 3 seconds. As shown in FIG. 1, the thickness of $SiO_2$ film achieved in one cycle is roughly completely and linearly dependent upon the film deposition temperature, where the film deposition speed rises as the film deposition temperature drops. In an embodiment, the film deposition speed is approx. 0.12 nm/cycle or more (such as 0.12 to 0.15 nm/cycle) when the film deposition temperature is approx. 40° C. or below (example explained later). Take note that in an embodiment, oxygen reactant gas and purge gas can be introduced using pulses in the above PEALD cycle. Also, each gas need not comprise one type of gas only, but a mixture of multiple types of gases can also be used.

Figure 2:
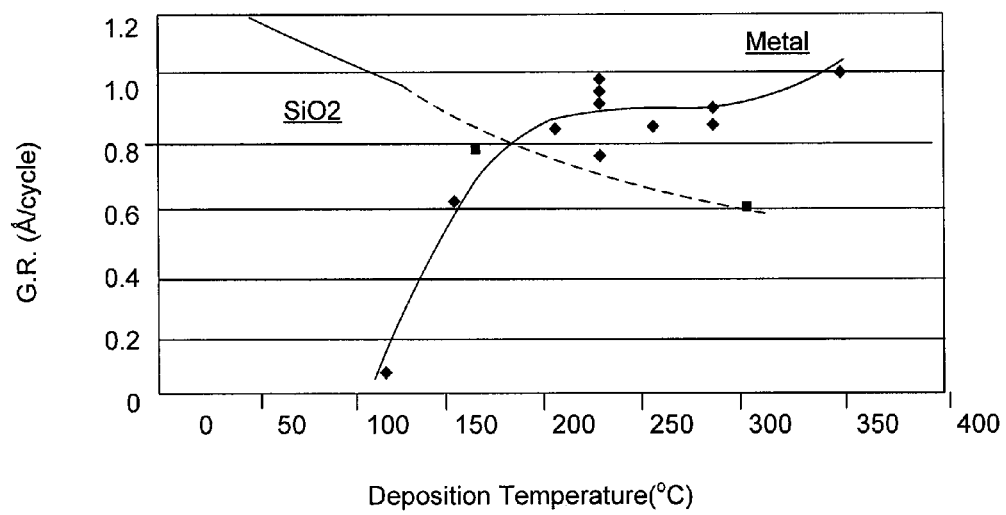
FIG. 2 is a graph showing the relationship between the growth rate (nm/cycle) and deposition temperature (° C.) of a $SiO_2$ ALD film according to an embodiment of the present invention, and the relationship between the growth rate (nm/cycle) and deposition temperature (° C.) of a metal ALD film according to a conventional method.

Surprisingly in the case of a $SiO_2$ film formed by PEALD as explained above, the film deposition speed is roughly completely and linearly dependent upon the film deposition temperature based on a negative slope, which is significantly different from the metal film deposition speed by conventional PEALD. FIG. 2 shows an example of the relationship of film deposition speed and film deposition temperature of metal film (W) by PEALD. As the film deposition temperature rises, the film deposition speed also rises. Also, it is necessary to perform the process at relatively high temperatures in order to form an atomic film, where the temperature is normally 200° C. or above (typically 300° C. or above). If the temperature drops to below 200° C., the film deposition speed drops significantly. With a $SiO_2$ film by PEALD, on the other hand, the film deposition speed rises at lower temperatures and drops at higher temperatures. In addition, the relationship of film deposition speed and deposition temperature deviates from that of a linear function when the temperature exceeds 100° C.

In the example shown in FIG. 1, the relationship satisfies $y=0.0005x+0.1397$, where y represents film deposition speed and x represents film deposition temperature. By obtaining a standard curve like this one in advance, the relationship of temperature and time needed to achieve a desired film thickness can be accurately grasped and accurate film deposition control can be achieved with ease. For example, the film deposition time can be calculated precisely once desired levels of film thickness and film deposition temperature are set. If the film deposition cycle is constant, on the other hand, the film deposition temperature needed to achieve a desired film thickness can be set precisely. The $SiO_2$ film thickness, although varying depending on the purpose, is in a range of approx. 5 to 40 nm in an embodiment, which corresponds to a range of approx. 40 to 330 cycles.

In the present disclosure where conditions and/or structures are not specified, the skilled artisan in the art can readily provide such conditions and/or structures, in view of the present disclosure, as a matter of routine experimentation.

The present invention will be explained in detail with reference to specific examples which are not intended to limit the present invention. The numerical numbers applied in the specific examples may be modified by a range of at least ±50%, wherein the endpoints of the ranges may be included or excluded.

Example

Three types of photoresist A, B and C (line width 40 nm, thickness 120 nm) were formed on substrates, as organic films, where the photoresist films for ArF laser had a structural composition based on an alkyl substitution product of acrylate or methacrylate ester polymer or copolymer, after which a $SiO_2$ film was deposited by PEALD on top. The film deposition conditions were as follows:
Silicon-containing precursor: BDEAS
Flow rate of silicon-containing precursor: 500 sccm
Silicon-containing precursor pulse: 0.5 sec
Flow rate of oxygen: 600 sccm
Flow rate of Ar: 1.5 sccm
RF power (13.56 MHz): 50 W
RF power pulse: 0.3 sec
Interval between silicon-containing precursor pulse and RF power pulse (purge before application of RF power): 0.3 sec
Interval between RF power pulse and silicon-containing precursor pulse (purge after application of RF power): 0.3 sec
Film deposition pressure: 400 Pa
Duration of one cycle: 1.5 sec As for the susceptor, one shown in FIGS. 5A and 5B was used. Ethylene glycol was used as coolant, and the flow rate and temperature of the coolant were adjusted by a chiller unit to adjust the susceptor temperature (temperature of top plate surface) to 80° C., 50° C. and 30° C., respectively. The film thickness was set to 9 nm, respectively. Since the relationship of film deposition temperature and film deposition speed satisfies the one shown in FIG. 1, the film deposition time at each temperature can be set with high accuracy.

Figure 6:
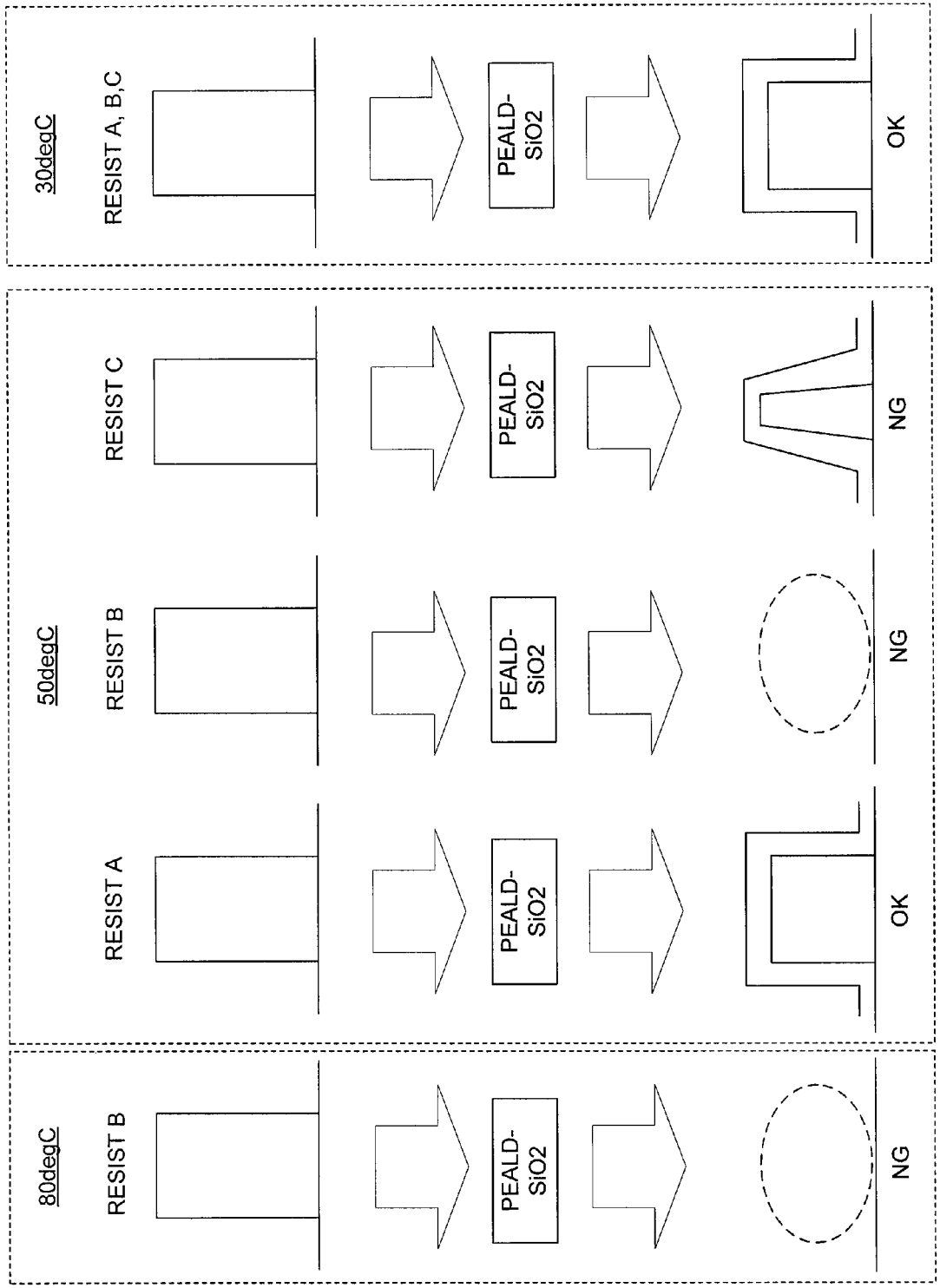
FIG. 6 schematically illustrates changes in the shape of resists depending on the deposition temperature of a $SiO_2$ ALD film by PEALD.

FIG. 6 is a schematic drawing that evaluates the results by observing the section views. Deformation of the organic film, or photoresist, was observed depending on the film deposition temperature during the formation of SiO$_2$ film by PEALD. To be specific, photoresist B disappeared almost completely when the SiO$_2$ film deposition temperature was 80° C. and 50° C. Photoresist C did not disappear completely, but a majority of it disappeared and notable deformation occurred when the SiO$_2$ film deposition temperature was 50° C. Photoresist A virtually maintained its original shape even when the SiO$_2$ film deposition temperature was 50° C. This way, notable deformation occurred with some types of photoresist when the SiO$_2$ film deposition temperature was approx. 50° C. On the other hand, every photoresist maintained its original shape and underwent no deformation when the SiO$_2$ film deposition temperature was 30° C.

Conventional ALD is a high-temperature process involving film deposition temperatures of 300° C. or above where organic films and other resist patterns disappear. Although PEALD allows for film deposition at approx. 50° C., achieving stable temperature control is difficult with conventional heating susceptors and these susceptors cannot be used at lower temperatures. Accordingly, there has been a problem that ALD/PEALD cannot be used in certain resist-based applications. According to an embodiment of the present invention, damage-induced deformation and disappearance of organic film or other type of resist can be reduced and prevented at film deposition temperatures of −10 to 80° C., by using a susceptor in which coolant is circulated. In particular, resist damage can be inhibited reliably by adjusting the film deposition temperature to below 50° C., or preferably to 40° C. or below. The film deposition speed can also be improved.

Figure 4A:
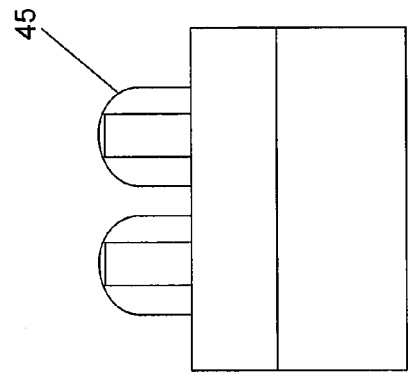
FIGS. 4A to 4F illustrate double patterning of a contact array using a $SiO_2$ ALD film according to an embodiment of the present invention.
Figure 4B:
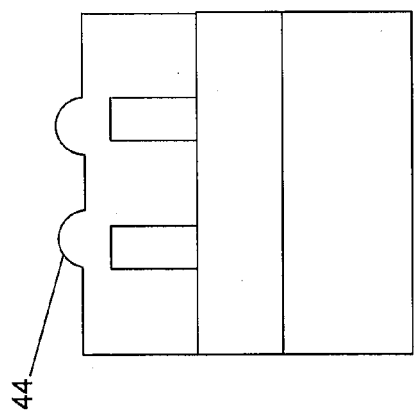
Figure 4C:
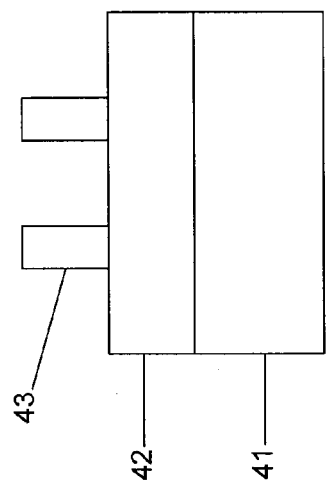
Figure 4D:
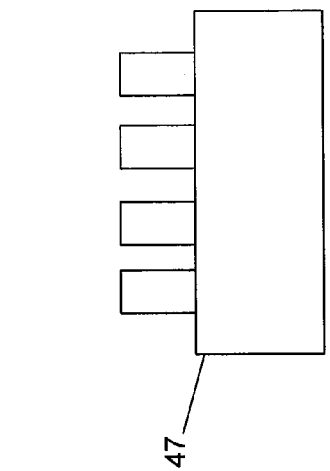
Figure 4E:
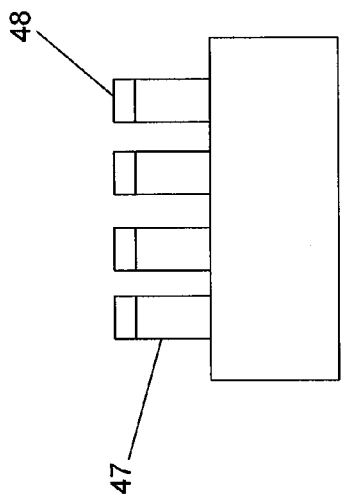
Figure 4F:
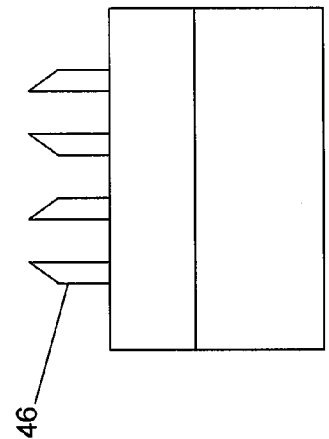

Such SiO$_2$ film can be applied favorably to spacer technology and can be used for double-patterning, for example. FIGS. 4A to 4F are schematic drawings showing one example. In this example, the SiO$_2$ film functions as a double-patterning spacer in the negative mode and is used as an etch mask for pattern transfer. In FIG. 4A, a patterning layer 42 (such as polysilicon) is formed on a substrate 41, and a line or etched line 43 is formed on top using photoresist which is an organic film. In FIG. 4B, a SiO$_2$ film is formed as a spacer material 44, by means of PEALD according to any of the embodiments of the present invention, on top of the photoresist line or etched line 43 and patterning layer 42. In FIG. 4C, the spacer material 44 is etched to expose only the top of the line 43 from the spacer material 44, while the patterning layer 42 is exposed between the lines 43 and the spacer material is removed except on the side walls of the line 42 (45). In FIG. 4D, the line 43 is removed to leave only the spacer material 45 (46). In FIG. 4E, the spacer material 46 is used as a hard mask to etch the patterning layer 42 to form a pattern 47. At this time, the spacer material partially remains at the top of the pattern 47 (48). In FIG. 4F, the remaining spacer material 48 is removed to complete the patterning. In this embodiment of the present invention, the photoresist material 43, which is an organic film, is not damaged in the SiO$_2$ film forming process by PEALD and thus its deformation can be inhibited. As a result, a spacer pattern can be etched with good resolution using a SiO$_2$ film. In double-patterning, it is important that the organic film does not undergo deformation, and in this respect application of embodiments of the present invention is extremely effective. It should be noted that those skilled in the art should be able to understand that SiO$_2$ films formed according to embodiments of the present invention can be applied to other patterning technologies and spacer technologies, as well, based on the information disclosed in this Specification, and they can implement such applications accordingly.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of double-patterning by depositing a silicon oxide film on a resist pattern or etched lines formed on a substrate by plasma enhanced atomic layer deposition (PEALD), comprising:

providing a substrate having a patterning layer on which adjacent lines constituted by a resist pattern or etched lines are formed in a PEALD reactor, said resist pattern or etched lines being formed of an organic film susceptible to deformation by heat;

controlling a temperature of a susceptor on which the substrate is placed at less than 50° C. or lower as a deposition temperature;

introducing a silicon-containing precursor and an oxygen-supplying reactant to the PEALD reactor and applying RF power therein in a cycle, while the deposition temperature is controlled substantially at a constant temperature of less than 50° C., thereby depositing a silicon oxide atomic layer over the lines while inhibiting deformation of the lines, each line having a top and two side walls;

repeating the cycle multiple times substantially at the constant temperature to deposit a silicon oxide film in contact with and fully covering the lines;

etching the silicon oxide film to expose each line from the silicon oxide film only at the top and to expose the patterning layer between the adjacent lines, so that the silicon oxide film is left only on the two side walls of each line on the patterning layer, constituting double-patterning spacers;

removing the lines to leave only the double-patterning spacers;

etching the patterning layer in its thickness direction using the double-patterning spacers as an etch mask to form a pattern corresponding to the double-patterning spacers in the patterning layer; and removing remaining double-patterning spacers, if any, on the tops of the pattern.

2. The method according to claim 1, wherein the deposition temperature is controlled substantially at a constant temperature of 40° C. or lower.

3. The method according to claim 2, wherein the deposition temperature is controlled substantially at a constant temperature of 30° C. or lower.

4. The method according to claim 1, wherein in the cycle, a purge gas is introduced to the PEALD reactor to remove excess of the silicon-containing precursor.

5. The method according to claim 1, wherein in the cycle, the silicon-containing precursor is introduced in a first pulse, and the RF power is applied in a second pulse, wherein the first and second pulses do not overlap.

6. The method according to claim 5, wherein the oxygen-supplying reactant is introduced constantly.

7. The method according to claim 5, wherein in the cycle, a purge gas is constantly introduced to the PEALD reactor.

8. The method according to claim 1, wherein the silicon-containing precursor is an amino silane gas.

9. The method according to claim 8, wherein the amino silane gas is selected from the group consisting of bisdiethylaminosilane (BDEAS), bisethylmethylaminosilane (BEMAS), trisdimethylaminosilane (3DMA), and hexakisethylaminosilane (HEAD).

10. The method according to claim 1, wherein the oxygen-supplying gas is $O_2$ gas.

11. The method according to claim 4, wherein the purge gas is a rare gas.

12. The method according to claim 1, wherein the cycle has a duration of about 1.5 to about 3.0 seconds.

13. The method according to claim 1, wherein a growth rate of the silicon oxide layer is about 0.120 nm/cycle or higher.

14. The method according to claim 13, wherein the temperature of the susceptor is set according to the following equation: $y=-0.0005x \pm 0.1397$ wherein y is the growth rate (nm), and x is the deposition temperature (° C.).

15. The method according to claim 1, wherein deposition temperature is adjusted by passing a coolant through a conduit formed in the susceptor.

16. The method according to claim 1, wherein the RF power is applied using a capacitively coupled parallel electrodes, and the susceptor functions as a lower electrode and holds a single substrate.

17. The method according to claim 1, further comprising, before the substrate is provided in the PEALD reactor:
   obtaining a standard curve defining a relationship between the growth rate of the silicon oxide layer and the deposition temperature;
   setting a growth rate of the silicon oxide layer in a cycle; and
   obtaining a deposition temperature based on the set growth rate using the standard curve.

18. The method according to claim 17, wherein the standard curve is $y=0.0005x+0.1397$ wherein y is the growth rate (nm), and x is the deposition temperature (° C.).

19. A method of double-patterning by depositing a silicon oxide film on a resist pattern or etched lines formed on a substrate by plasma enhanced atomic layer deposition (PEALD), comprising:
   providing a substrate having a patterning layer on which lines constituted by a resist pattern or etched lines are formed in a PEALD reactor, said resist pattern or etched lines being formed of an organic film susceptible to deformation by heat;
   controlling a temperature of a susceptor on which the substrate is placed at less than 50° C. or lower as a deposition temperature;
   introducing a silicon-containing precursor and an oxygen-supplying reactant to the PEALD reactor and applying RF power therein in a cycle, while the deposition temperature is controlled substantially at a constant temperature of 20° C. or lower, thereby depositing a silicon oxide atomic layer on the lines while inhibiting deformation of the lines;
   repeating the cycle multiple times substantially at the constant temperature to deposit a silicon oxide film on the lines;
   etching the silicon oxide film to expose the lines from the silicon oxide film only at their top and to expose the patterning layer between the lines, so that the silicon oxide, film is left only on side walls of the lines on the patterning layer, and constitutes double-patterning spacers;
   removing the lines to leave only the double-patterning spacers;
   etching the patterning layer using the double-patterning spacers as an etch mask to form a pattern using the patterning layer; and
   removing remaining double-patterning spacers, if any, on the tops of the pattern.

* * * * *